US010103540B2

(12) United States Patent
Kashyap et al.

(10) Patent No.: US 10,103,540 B2
(45) Date of Patent: Oct. 16, 2018

(54) METHOD AND SYSTEM FOR TRANSIENT VOLTAGE SUPPRESSION DEVICES WITH ACTIVE CONTROL

(71) Applicant: General Electric Company, Schenectady, NY (US)

(72) Inventors: Avinash Srikrishnan Kashyap, Niskayuna, NY (US); Peter Micah Sandvik, Niskayuna, NY (US); Joe Walter Kirstein, Orland Park, IL (US); Alexander Viktorovich Bolotnikov, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 751 days.

(21) Appl. No.: 14/261,195

(22) Filed: Apr. 24, 2014

(65) Prior Publication Data
US 2015/0311701 A1 Oct. 29, 2015

(51) Int. Cl.
*H02H 9/04* (2006.01)
*H01L 21/02* (2006.01)
(Continued)

(52) U.S. Cl.
CPC .......... *H02H 9/04* (2013.01); *H01L 21/02378* (2013.01); *H01L 21/02529* (2013.01);
(Continued)

(58) Field of Classification Search
CPC ............ G01R 31/2874; G01R 31/2875; G01R 31/2891; G01R 1/0458; G01R 31/2642;
(Continued)

(56) References Cited

U.S. PATENT DOCUMENTS 5,245,412 A * 9/1993 Clark .................. H01L 23/3107
257/601
5,416,663 A * 5/1995 Atkins .................. H02H 9/005
361/111
(Continued)

FOREIGN PATENT DOCUMENTS

CN 202423293 U 9/2012
WO 2004036625 A2 4/2004
(Continued)

OTHER PUBLICATIONS

K.V. Vassilevski, K. Zekentes, A.B. Horsfall, C.M. Johnson, N.G. Wright; Low Voltage Silicon Carbide Zener Diode; © (2004) Trans Tech Publications, Switzerland; Materials Science Forum vols. 457-460 {2004) pp. 1029-1032.*
(Continued)

*Primary Examiner* — Christopher McAndrew
(74) *Attorney, Agent, or Firm* — GE Global Patent Operation; Nitin Joshi

(57) ABSTRACT

A transient voltage suppression (TVS) device and a method of forming the device are provided. The transient voltage suppression (TVS) device includes a first layer of wide band gap semiconductor material formed of a first conductivity type material, a second layer of wide band gap semiconductor material formed of a second conductivity type material over at least a portion of the first layer, and a third layer of wide band gap semiconductor material formed of the first conductivity type material over at least a portion of the second layer. The TVS device also includes a conductive path electrically coupled between the second layer and an electrical connection to a circuit external to the TVS device, the conductive path configured to permit controlling a turning on of the TVS device at less than a breakdown voltage of the TVS device.

29 Claims, 4 Drawing Sheets

(51) Int. Cl.

| | | |
|---|---|---|
| H01L 21/768 | (2006.01) | |
| H01L 25/00 | (2006.01) | |
| H01L 29/16 | (2006.01) | |
| H01L 27/02 | (2006.01) | |
| H01L 25/065 | (2006.01) | |
| H01L 29/70 | (2006.01) | |
| G01R 31/28 | (2006.01) | |
| G01R 1/04 | (2006.01) | |
| G01R 31/26 | (2014.01) | |
| H01L 29/423 | (2006.01) | |
| H01L 29/732 | (2006.01) | |

(52) U.S. Cl.
CPC .... *H01L 21/76898* (2013.01); *H01L 25/0657* (2013.01); *H01L 25/50* (2013.01); *H01L 27/0255* (2013.01); *H01L 29/1608* (2013.01); *H01L 29/423* (2013.01); *H01L 29/70* (2013.01); *H02H 9/044* (2013.01); *G01R 1/0458* (2013.01); *G01R 31/2642* (2013.01); *G01R 31/2874* (2013.01); *G01R 31/2875* (2013.01); *G01R 31/2891* (2013.01); *H01L 29/42304* (2013.01); *H01L 29/732* (2013.01); *H01L 2225/06541* (2013.01); *H01L 2924/0002* (2013.01)

(58) Field of Classification Search
CPC .. H01L 21/02378; H01L 27/0255; H02H 9/04
USPC .................................................. 324/750.03
See application file for complete search history.

(56) References Cited

U.S. PATENT DOCUMENTS

| | | | | |
|---|---|---|---|---|
| 5,500,629 | A * | 3/1996 | Meyer | H01F 1/36 333/181 |
| 5,539,604 | A | 7/1996 | Clark et al. | |
| 5,900,651 | A | 5/1999 | Kitagawa et al. | |
| 6,015,999 | A | 1/2000 | Yu et al. | |
| 6,298,134 | B1 * | 10/2001 | Curry | H02H 9/042 379/399.01 |
| 6,734,462 | B1 | 5/2004 | Shah | |
| 7,116,567 | B2 * | 10/2006 | Shelton | H02M 1/4225 361/91.5 |
| 7,391,057 | B2 * | 6/2008 | Ryu | H01L 29/0661 257/107 |
| 7,554,839 | B2 * | 6/2009 | Bobde | H01L 27/0259 327/310 |
| 7,557,554 | B2 * | 7/2009 | Chang | H02M 3/157 323/284 |
| 7,719,813 | B2 | 5/2010 | Chen | |
| 7,781,826 | B2 * | 8/2010 | Mallikararjunaswamy | H01L 27/0727 257/328 |
| 7,880,223 | B2 * | 2/2011 | Bobde | H01L 29/407 257/328 |
| 7,893,778 | B2 * | 2/2011 | Mohtashemi | H03K 4/502 331/177 R |
| 8,441,765 | B2 | 5/2013 | Barbier et al. | |
| 8,445,917 | B2 * | 5/2013 | Haney | H01L 29/1608 257/481 |
| 8,530,902 | B2 * | 9/2013 | Kashyap | H01L 23/3185 257/76 |
| 8,557,671 | B2 * | 10/2013 | Guan | H01L 27/0259 257/E21.09 |
| 8,710,627 | B2 * | 4/2014 | Guan | H01L 27/0814 257/566 |
| 8,730,629 | B2 | 5/2014 | Kashyap et al. | |
| 8,754,435 | B1 * | 6/2014 | Tischler | H01L 33/32 257/98 |
| 8,765,524 | B2 * | 7/2014 | Kashyap | H01L 23/3185 257/76 |
| 8,803,491 | B2 * | 8/2014 | Kobayashi | H02M 3/158 323/225 |
| 8,982,524 | B2 * | 3/2015 | Kao | H01L 27/0814 361/111 |
| 9,042,072 | B2 * | 5/2015 | Knobloch | H01B 7/2813 361/111 |
| 2004/0036625 | A1 * | 2/2004 | Omata | G07C 9/00309 340/12.22 |
| 2004/0070029 | A1 * | 4/2004 | Robb | H01L 27/0623 257/332 |
| 2008/0063592 | A1 * | 3/2008 | Nakahara | B01J 20/20 423/449.1 |
| 2008/0218922 | A1 * | 9/2008 | Mallikararjunaswamy | H01L 27/0262 361/91.6 |
| 2008/0296771 | A1 * | 12/2008 | Das | H01L 21/0475 257/758 |
| 2009/0079022 | A1 * | 3/2009 | Keena | H01L 27/0255 257/494 |
| 2009/0162988 | A1 * | 6/2009 | Keena | H01L 27/0255 438/400 |
| 2009/0261897 | A1 * | 10/2009 | Bobde | H01L 23/60 327/552 |
| 2009/0290276 | A1 | 11/2009 | Carcouet et al. | |
| 2010/0237356 | A1 * | 9/2010 | Haney | H01L 29/1608 257/77 |
| 2010/0244090 | A1 * | 9/2010 | Bobde | H01L 27/0259 257/112 |
| 2010/0321840 | A1 * | 12/2010 | Bobde | H01L 27/0266 361/56 |
| 2012/0081097 | A1 * | 4/2012 | Birnbach | G05F 1/10 323/304 |
| 2012/0127619 | A1 | 5/2012 | Mikolajczak | |
| 2012/0200967 | A1 * | 8/2012 | Mikolajczak | H02H 3/20 361/79 |
| 2013/0027819 | A1 * | 1/2013 | Aronov | H02H 3/167 361/42 |
| 2013/0105816 | A1 * | 5/2013 | Kashyap | H01L 23/3185 257/77 |
| 2013/0119548 | A1 * | 5/2013 | Avouris | B82Y 10/00 257/762 |
| 2013/0163139 | A1 * | 6/2013 | Kashyap | H01L 29/36 361/111 |
| 2013/0240903 | A1 | 9/2013 | Kashyap et al. | |
| 2013/0240908 | A1 * | 9/2013 | Haney | H01L 29/1608 257/77 |
| 2013/0258541 | A1 * | 10/2013 | Knobloch | H01B 7/2813 361/111 |
| 2013/0328064 | A1 * | 12/2013 | Kashyap | H01L 23/3185 257/77 |

FOREIGN PATENT DOCUMENTS

| | | |
|---|---|---|
| WO | 2008063592 A2 | 5/2008 |
| WO | 2013119548 A1 | 8/2013 |

OTHER PUBLICATIONS

Yu et al., "Punchthrough Transient Voltage Suppressor for EOS/ESD Protection of Low-Voltage IC's", Electrical Overstress/Electrostatic Discharge Symposium Proceedings, Phoenix, AZ, USA, 1995, pp. 27-33, Sep. 12-14, 1995.*

Maier et al., "Modeling of silicon carbide (SiC) power devices for electronic switching in low voltage applications", Power Electronics Specialists Conference, 2004. PESC 04. 2004 IEEE 35th Annual, vol. 4, pp. 2742-2745, 2004.

Handt et al., "Intelligent, compact and robust semiconductor circuit breaker based on silicon carbide devices", Power Electronics Specialists Conference, 2008. PESC 2008. IEEE, pp. 1586-1591, Jun. 2008.

Alexander Viktorovich Bolotnikov et al., Oct. 3, 2014, U.S. Appl. No. 14/505,975.

(56) References Cited

OTHER PUBLICATIONS

A European Search Report and Opinion issued in connection with corresponding EP Application No. 15164717.9 dated Oct. 7, 2015.

* cited by examiner

METHOD AND SYSTEM FOR TRANSIENT VOLTAGE SUPPRESSION DEVICES WITH ACTIVE CONTROL

BACKGROUND

This description relates to semiconductor devices, and, more particularly, to transient voltage suppressor (TVS) diodes having an active control and methods of forming them using wide-band gap materials.

Protection devices, such as, conventional transient voltage suppression (TVS) devices using semiconductor materials typically have only two terminals connecting them to circuits to be protected. The TVS devices breakdown at a predetermined voltage, such that a transient (overvoltage) is suppressed above device breakdown voltage to protect respective circuits. TVS devices cannot be externally triggered to cause them to breakdown at other than the predetermined voltage. Certain conditions warrant the operation of the TVS device before a transient voltage affects the circuit. External intervention prior to the TVS device reaching its breakdown voltage is not possible.

BRIEF DESCRIPTION

In one embodiment, a transient voltage suppression (TVS) device is provided. The TVS device includes a first layer of wide band gap semiconductor material formed of a first conductivity type material. The TVS device also includes a second layer of wide band gap semiconductor material formed of a second conductivity type material over at least a portion of the first layer. The TVS device further includes a third layer of wide band gap semiconductor material formed of the first conductivity type material over at least a portion of the second layer. The TVS device also includes a conductive path electrically coupled between the second layer and an electrical connection to a circuit external to the TVS device. The conductive path is configured to permit controlling a turning on of the TVS device at less than a breakdown voltage of the TVS device.

In another embodiment, a method of forming a transient voltage suppression (TVS) assembly is provided. The method includes providing a silicon carbide substrate having a first surface and an opposite second surface. The method also includes forming a first silicon carbide semiconductor layer having a conductivity of a first polarity over at least a portion of the first surface. The method further includes forming a second silicon carbide semiconductor layer having a conductivity of a second polarity over at least a portion of the first surface. The method also includes forming a third silicon carbide semiconductor layer having a conductivity of the first polarity over at least a portion of the first surface. The method further includes forming a conductive path from the second silicon carbide semiconductor layer to a connection point to a circuit external to the TVS device. The method also includes operating the TVS device using a control signal applied to the conductive path at a voltage lower than a breakdown voltage of the TVS device.

In yet another embodiment, a transient voltage suppression (TVS) assembly for protecting electronic equipment from transient electrical energy is provided. The TVS assembly is configured to divert electrical energy from the electronic equipment. The TVS assembly includes a plurality of TVS devices coupled together in at least electrical parallel. The plurality of TVS devices each includes an anode, a cathode, and a control lead. The control lead extends through a portion of the TVS device to a second layer of the TVS device. A first layer is formed of a wide band gap semiconductor material of a first conductivity type material. The second layer is formed of the wide band gap semiconductor material of a second conductivity type material and formed between the first layer and a third layer. The third layer is formed of the wide band gap semiconductor material of the first conductivity type material. The TVS assembly also includes a control circuit including an output terminal communicatively coupled to at least some of the control leads. The control circuit also includes an input terminal configured to sense a turning on of at least some of the TVS devices. The control circuit is configured to generate a control output signal that varies a turning on threshold of the at least some of the TVS devices or is indicative of the turning on of the at least some of the TVS devices. The control circuit is also configured to apply the control output signal to at least some of the control leads such that the turning on of the plurality of TVS devices is controlled individually or collectively at less than the breakdown voltage of the plurality of TVS devices.

DRAWINGS

These and other features, aspects, and advantages of the present disclosure will become better understood when the following detailed description is read with reference to the accompanying drawings in which like characters represent like parts throughout the drawings, wherein.

Figure 6:
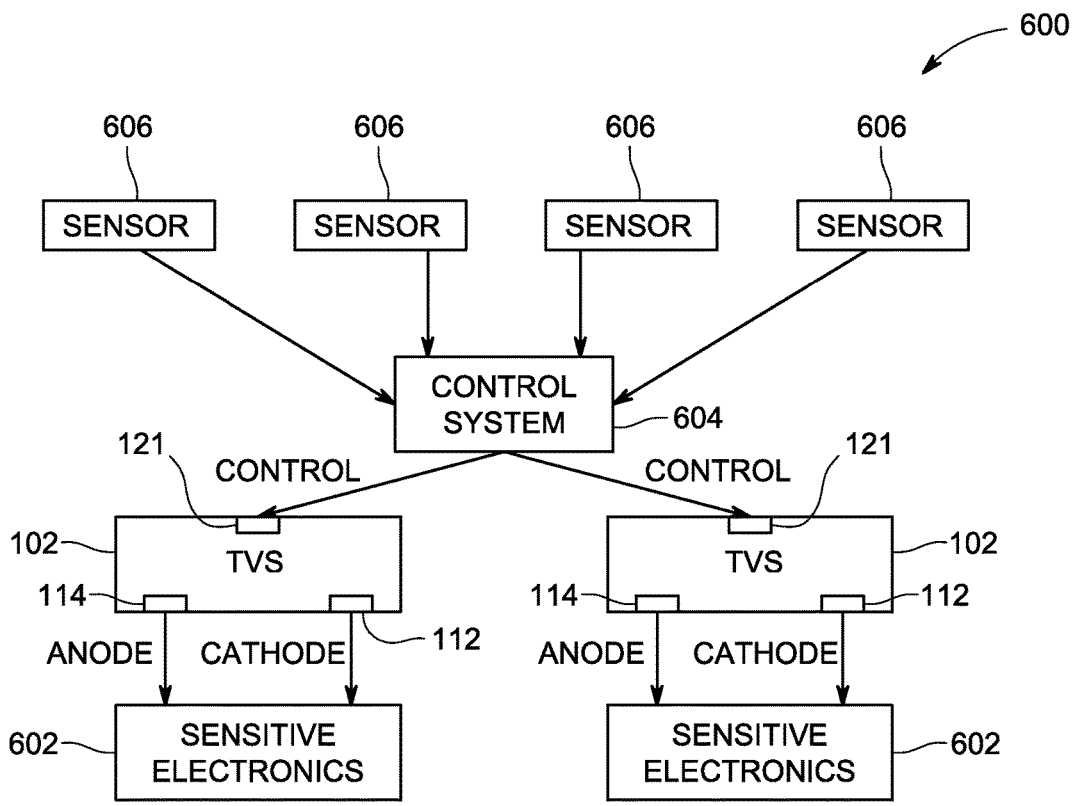
Figure 7:
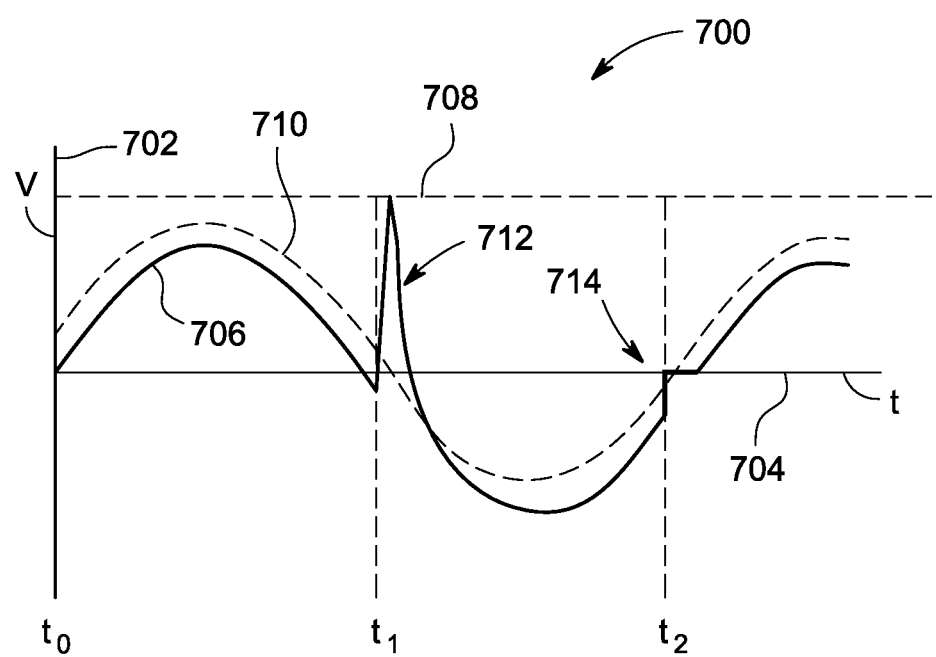

FIG. 6 is a schematic block diagram of an anticipatory fault protection system 600 in accordance with an exemplary embodiment of the present disclosure; and FIG. 7 is a graph 700 of voltage sensed at anode 114 of TVS device 102.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, references to n+ or p+ type conductivity materials implies a relatively high concentration of dopant impurities (e.g. $1\times10^{18}$-$1\times10^{21}$ cm-3). References to n– or p– type conductivity materials implies a relatively lower concentration of dopants (e.g. $1\times10^{14}$-$1\times10^{17}$ cm-3).

Embodiments of the present disclosure describe a transient voltage suppressor (TVS) or circuit protection device using silicon carbide (SiC) semiconductors having three or more terminals, which can trigger or turn on the TVS device when a desired voltage is applied to the control terminal. Triggering or turning on the TVS device permits current flow through the TVS device with a relatively low resistance. This triggering allows TVS turn-on at voltages that are less than the device predetermined breakdown voltage or voltage in a protected circuit, which may offer additional protection features with active controls.

A three terminal TVS device as described herein not only provides passive circuit protection but active protection as well. While the passive component is extremely useful in turning on protection when needed and turning itself back off after the transient voltage event, an additional active feature increases the protective characteristics. First, when paralleling multiple TVS devices, the trigger on each TVS can be activated such that when one TVS is activated the remaining TVS devices can be turned on as well to help distribute the energy. This near simultaneous distribution of energy helps alleviate the stresses on any single TVS device, thereby predictably extending the service life of the TVS device. The near simultaneous distribution of energy also facilitates the combination of TVS devices to consistently handle larger energy loads than paralleled passive devices since it is very difficult to manufacture TVS devices with identical characteristics. The near simultaneous distribution of energy also significantly reduces the impedance of the TVS network much earlier than passive units, thereby lowering the peak voltage the protected circuit experiences.

A second benefit of a three terminal TVS is that it can be used to shunt any circuit regardless of whether voltage transients exist across the device. Acting similarly to a static switch, this three terminal TVS device may be used to allow current flow for regular circuit operation.

The following description refers to the accompanying drawings, in which, in the absence of a contrary representation, the same numbers in different drawings represent similar elements.

Figure 1:
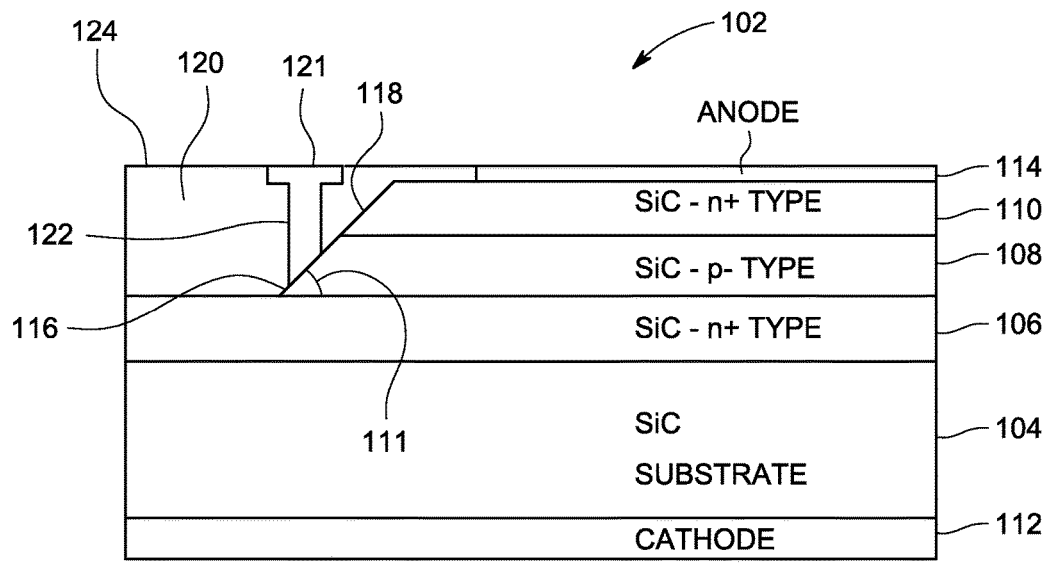
FIG. 1 is a cross-sectional view of a transient voltage suppression (TVS) semiconductor device.

FIG. 1 is a cross-sectional view of a transient voltage suppression (TVS) semiconductor device 102. In the exemplary embodiment, TVS device 102 includes a structure that is formed of a substrate 104 of, for example, silicon carbide having an n type conductivity and an epitaxially grown n+ type conductivity layer 106, an epitaxially grown p– layer 108 coupled in electrical contact with layer 106, and an epitaxially grown n+ layer 110 coupled in electrical contact with p– layer 108. Substrate 104 is typically doped with a dopant of a first conductivity type during substrate growth, or by epitaxy, implant, or diffusion processes. In some embodiments, layers 108 and/or 110 include a mesa structure with negative beveled edges, 116 and 118, respectively. A passivated or dielectric layer 120 prevents electrical contact between layers 106 and 110.

In various embodiments, a mesa angle 111 is formed less than 45° and positioned laterally closer to layer 106 than to n+ layer 110 to ensure depletion from the anode p-n junction is going to reach the opposite side of p– layer 108 before it reaches control terminal 121. In other embodiments, mesa angle 111 is formed less than 30°

In various other embodiments, n+ layer 110 and/or p– layer 108 are formed by ion-implantation. For example, in one embodiment, substrate 104 is an n+ layer, a very lightly doped n– epitaxy layer is formed on substrate 104, the n– epitaxy layer is then converted to a p– layer 108 by ion implantation, and n+ layer 110 may also be formed on p– layer 108 with an n+ implantation.

For relatively low voltage applications, forming p– layer 108 and/or n+ layer 110 by ion implantation may provide tighter control of the integrated charge of these layers, which in turn permits more accurate control of the electrical characteristics of TVS device 102.

A first electrical contact or cathode 112 is coupled in electrical contact with substrate 104. A second electrical contact or anode 114 is coupled in electrical contact with epitaxially grown n+ layer 110. TVS device 102 operates using "punch-through," or also known as, "reach-through" physics such that as the voltage across TVS device 102 is increased, a depletion region extends all across p– layer 108 and touches n+ layer 106 and n+ layer 110. This leads to a condition known as "punch-through" and large amounts of current are able to flow through TVS device 102. TVS device 102 is able to maintain this condition with minimal change in the voltage across it. In the exemplary embodiment, punch-through operation is achieved if $Na*t_{p-}/\varepsilon\varepsilon_0$ is greater than Ec, where Na is acceptor doping concentration in layer 108; $t_{p-}$ is the thickness of layer 108; ε is material permittivity; Ec is critical electric field. In embodiments where TVS device 102 is formed of a pnp junction, punch-through operation is achieved if $Nd*t_{n-}/\varepsilon\varepsilon_0$ is greater than Ec, where Nd is the donor doping concentration in layer 108; $t_{n-}$ is the thickness of layer 108.

In various embodiments, TVS device 102 is sized and formed to ensure a maximum electric field internal to the semiconductor material of TVS device 102 is maintained less than about two megavolts per centimeter. Additionally, TVS device 102 is configured to maintain an increase in blocking voltage of less than 5% for current in a range of less than approximately 1.0 nanoamp/cm$^2$ to approximately 1.0 milliamp/cm$^2$. As used herein, blocking voltage refers to the highest voltage at which TVS device 102 does not conduct or is still in an "off" state. Moreover, TVS device 102 is configured to maintain an electrical leakage current of less than approximately 1.0 microamp/cm$^2$ up to approximately the punch-through voltage of TVS device 102 at room temperature and less than 100.0 microamp/cm$^2$ up to approximately the punch-through voltage at operating temperatures of up to 225° Celsius.

In various embodiments, TVS device 102 is configured to exhibit punch-through characteristics between approximately 5.0 volts and approximately 75.0 volts. In various other embodiments, TVS device 102 is configured to exhibit punch-through characteristics between approximately 75.0 volts and approximately 200.0 volts. In still other embodiments, TVS device 102 is configured to exhibit punch-through characteristics at voltages greater than approximately 200 volts.

To form control terminal 121 for controlling the turning on of TVS device 102, a via 122 is etched into dielectric layer 120 from a surface 124 of dielectric layer 120 to p– layer 108. Because, via 122 passes through a dielectric material and does not contact any layer other than p– layer 108, via 122 is backfilled with a metal or other conductive material, by, for example, but, not limited to, sputtering. Control terminal 121 is positioned to be at least one depletion width (110-108 p-n junction) away from n+ layer 110 at breakdown (punch-through) voltage, otherwise TVS device 102 will reach breakdown at much lower voltage than the doping/thickness provides. Control terminal 121 is positioned to be at least one depletion width (p-n junction 106-108) away from n+ layer 106 at zero voltage between control terminal 121 and cathode 112.

During operation, a voltage applied to control terminal 121 lowers a p-n barrier of the bipolar junctions between n+ region 106 and p– region 108 causing carrier injection and TVS turn-on at a voltage lower than device predetermined voltage when there is no control voltage applied to control terminal 121.

Figure 2:
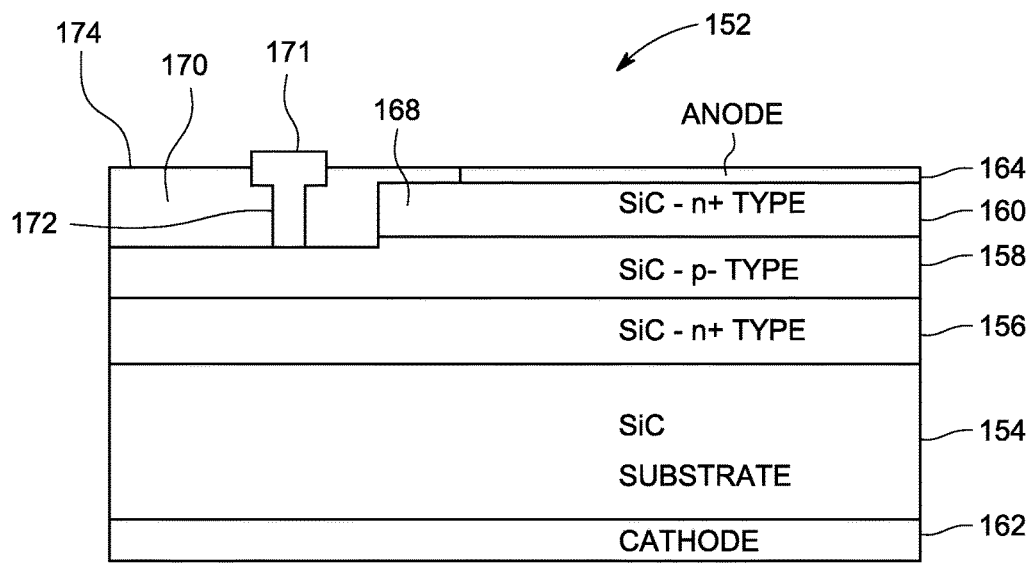
FIG. 2 is a cross-sectional view of an alternative TVS device.

FIG. 2 is a cross-sectional view of another embodiment of a transient voltage suppression (TVS) semiconductor device 152. In the exemplary embodiment, TVS device 152 is formed similarly to TVS device 102 shown in FIG. 1 except the p– layer and n+ layer adjacent anode 164 are not formed in a mesa structure, but rather have vertical sidewalls.

In the exemplary embodiment, TVS device 152 includes a structure that is formed of a substrate 154, an n+ type conductivity layer 156, a p– layer 158, and an n+ layer 160. A passivated or dielectric layer 170 prevents electrical contact between layer 158 and anode 164. A first electrical contact or cathode 162 is coupled in electrical contact with substrate 154. A second electrical contact or anode 164 is coupled in electrical contact with layer 160.

A via 172 is etched through dielectric layer 170 to provide a path for a control terminal 171 to connect layer 158 to circuits offboard TVS device 152. TVS device 152 includes a vertical mesa structure (sidewalls of layer 160 and 158).

Figure 3:
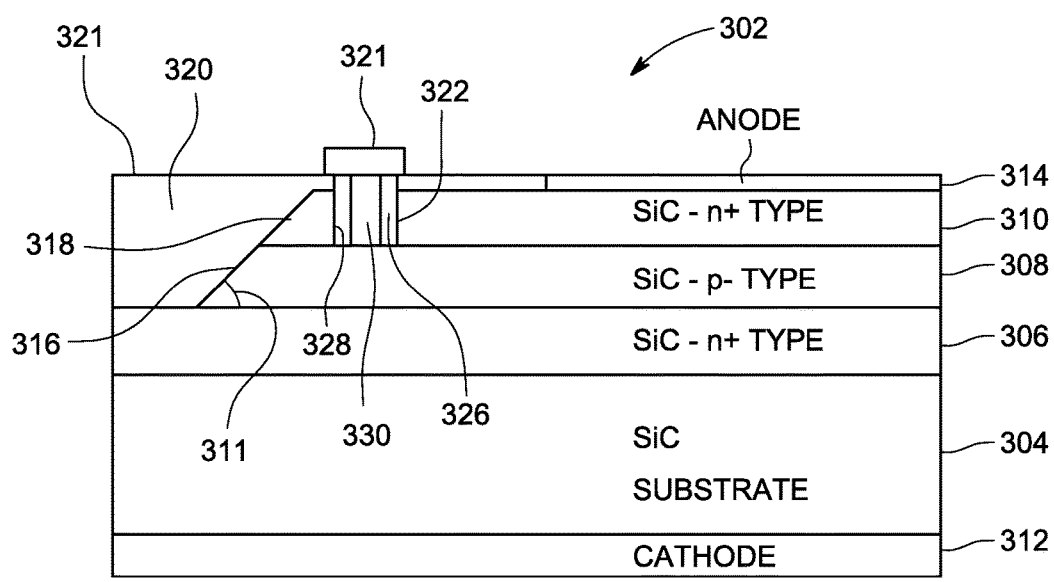
FIG. 3 is a cross-sectional view of another alternative TVS device.
Figure 4:
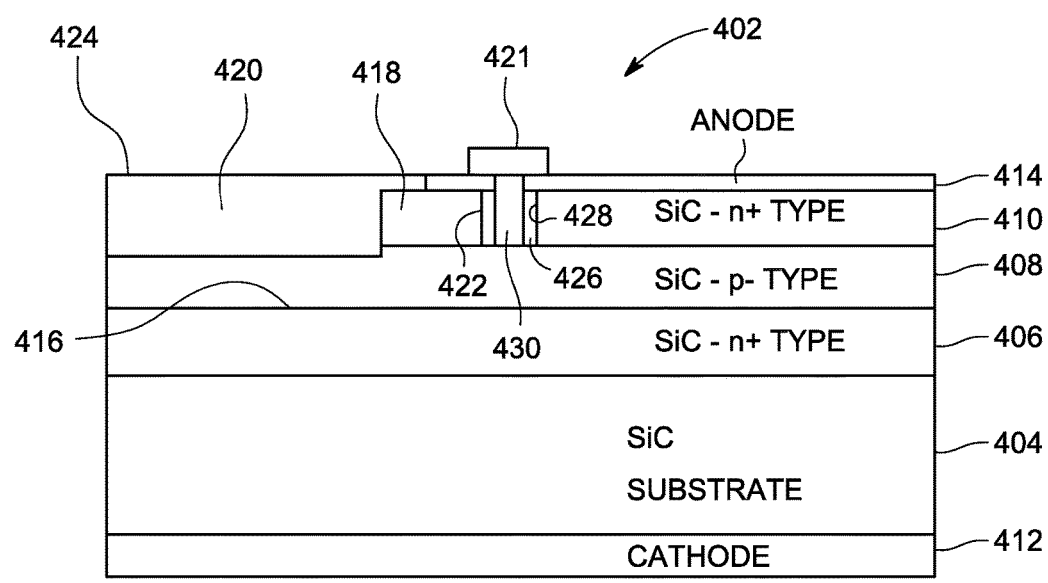
FIG. 4 is a schematic block diagram of an anticipatory fault protection system that may be used with the TVS device shown in FIGS. 1, 2, and 3.

FIG. 3 is a cross-sectional view of another embodiment of a transient voltage suppression (TVS) semiconductor device 302. In the exemplary embodiment, TVS device 302 is formed similarly to TVS device 102 shown in FIG. 1 except a control terminal 321 is formed through n+ layer 310 for control terminal 321 to connect p– layer 308 to circuits offboard TVS device 302. In the exemplary embodiment, a via 322 is etched through n+ layer 310. To insulate the conductive path of control terminal 321 in via 322 from n+ layer 310, an insulative sheath or dielectric coating 326 is deposited on an inner surface wall 328 of via 322 after etching via 322 through n+ layer 310. A conductive pillar 330 is, for example, sputtered into insulated via 322 to form control terminal 321. In this embodiment, a mesa angle 311 is formed at angle between approximately 15° and 90°. Control terminal 321 is positioned to be at least one depletion width away from 310 at breakdown (punch-through) voltage. Control terminal 321 is positioned to be at least one depletion width (p-n junction 306-308) away from n+ layer 306 at zero voltage between control terminal and cathode FIG. 4 is a cross-sectional view of another embodiment of a transient voltage suppression (TVS) semiconductor device 402. In the exemplary embodiment, TVS device 402 is formed similarly to TVS device 152 shown in FIG. 2 except a via 422 is formed through an n+ layer 406 to permit connecting a control terminal 421 between a p– layer 408 and circuits offboard TVS device 402.

In the exemplary embodiment, TVS device 402 includes a structure that is formed of a substrate 404, n+ layer 406, p– layer 408, and n+ layer 410. A passivated or dielectric layer 420 prevents electrical contact between p– layer 408 and a second electrical contact or anode 414. A first electrical contact or cathode 412 is coupled in electrical contact with substrate 404. Anode 414 is coupled in electrical contact with n+ layer 410. In the exemplary embodiment, a via 422 is etched through n+ layer 410 to provide a path for a control terminal 421 to connect p– layer 408 to circuits offboard TVS device 402. To insulate the conductive path of control terminal 421 in via 422 from n+ layer 410, an insulative sheath or dielectric coating 426 is deposited on an inner surface wall 428 of via 422 after etching via 422 through n+ layer 410. A conductive pillar 430 is, for example, sputtered into insulated via 422 to form control terminal 421. Control terminal 421 is positioned to be at least one depletion width away from n+ layer 410 at breakdown (punch-through) voltage. Control terminal 421 is positioned to be at least one depletion width (p-n junction 406-408) away from n+ layer 406 at zero voltage between control terminal 121 and cathode 412. TVS device 402 includes a vertical mesa structure (sidewalls of n+ layer 410 and p– layer 408).

Figure 5:
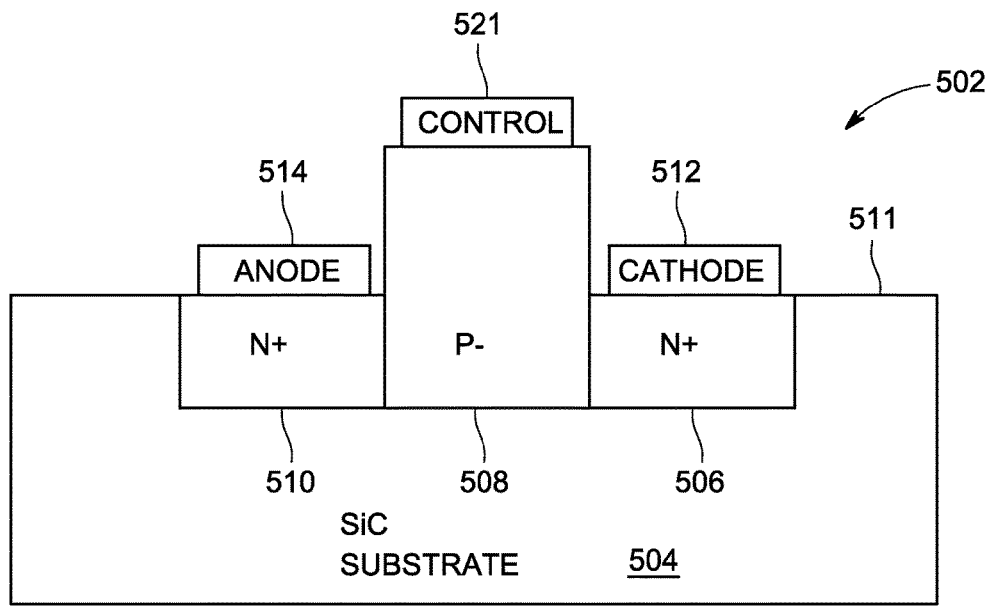
FIG. 5 is a graph of voltage sensed at an exemplary cathode of TVS device 102 shown in FIG. 1.

FIG. 5 is a cross-sectional view of TVS device 502 in accordance with another exemplary embodiment of the present disclosure. In the exemplary embodiment, TVS device 502 is formed laterally across a surface of a substrate 504 that is formed of, for example, silicon carbide having an n type conductivity. An n+ type conductivity region 506, a p– type conductivity region 508, and an n+ type conductivity region 510 are formed in a surface 511. In the example embodiment, substrate 504 is typically doped with a p– type dopant during substrate growth, or by epitaxy, implant, or diffusion processes.

In various other embodiments, regions 506, 508, and 510 are formed by etching, and diffusion or ion-implantation of appropriate dopants. A first electrical contact or cathode 512 is coupled in electrical contact with region n+ region 506. A second electrical contact or anode 514 is coupled in electrical contact with region 510. A control terminal 521 is coupled in electrical contact with region 508. Region 508 is extended upward by at least an n+-to-n+ distance (n+ region 506 to n+ region 510 distance) to be at least one depletion width away from anode 514 and cathode 512 at breakdown (punch-through) voltage to prevent TVS device 502 from reaching breakdown at a lower voltage than the doping/thickness would provide for.

During operation, a voltage applied to control terminal 521 lowers a p-n barrier of the bipolar junctions between n+ region 506 and p– region 508 causing carrier injection and TVS turn-on at a voltage lower than device predetermined voltage when there is no control voltage applied to control terminal 521.

FIG. 6 is a schematic block diagram of an anticipatory fault protection system 600 in accordance with an exemplary embodiment of the present disclosure. In the exemplary embodiment, one or more TVS devices 102 are electrically coupled to respective sensitive electronics 602. During a transient voltage event with TVS device 102 in a passive mode, where only anode 114 and cathode 112 are coupled to sensitive electronics 602, TVS devices 102 turn on when a voltage between anode 114 and cathode 112 reaches a predetermined value. When TVS devices 102 turn on, they shunt excess electrical energy away from sensitive electronics 602. When the voltage between anode 114 and cathode 112 falls below a determinable value, TVS devices 102 turn off and do not continue to conduct electricity. However, using control terminal 121, a turn on voltage value is not fixed at the predetermined value, but can be selectable amongst a plurality of different values depending on a magnitude of a control signal applied to control terminal 121.

A control system 604 is configured to generate control signals that are applied to control terminal 121 on each TVS device 102. In one embodiment, control system 604 and an associated sensor 606 are embodied in a resistor in electrically coupled in series with cathode 112 or anode 114 that generates a predetermined voltage upon a current inrush of sufficient size when one of TVS devices turns on. The voltage generated when a first TVS device turns on is applied to control terminal 121 of the remaining TVS devices 102 to turn them on as well, such that all TVS devices turn on at approximately the same time. Of course, there will be a small time delay due to propagation delays from one TVS device to another. Control system 604 and associated sensors 606 may also include a current sensor providing a direct current indication to control system 604. In various embodiments, control system 604 is a processor-based controller formed of silicon carbide or other wide band-gap material.

FIG. 7 is a graph 700 of voltage sensed at anode 114 of TVS device 102. Graph 700 includes an x-axis 702 graduated in units of time (seconds) and a y-axis 704 graduated in units of voltage (V). A trace 706 illustrates a voltage with respect to time detected at anode 114 of TVS device 102 during operation. A trace 708 illustrates a passive setpoint for actuating TVS device 102 based on a breakdown voltage associated with TVS device 102 between anode 114 and cathode 112. A trace 710 illustrates an active setpoint for actuating TVS device 102 based on control signals that are applied to control terminal 121 of TVS device 102.

When relying only on the passive setpoint 708, for example, at t1, a first transient voltage spike 712 is permitted to attain a relatively high magnitude before TVS device 102 actuates at passive setpoint 708 to shunt the transient electrical energy to ground. However, when also relying on active setpoint 710, a second transient voltage spike 714, for example, at t2, is not permitted to be so disruptive before TVS device 102 actuates at active setpoint 710 to shunt the transient electrical energy to ground. Although illustrated as a simple sine wave, the voltage at anode 114 may be any signal.

The above-described embodiments of a method and system of forming a transient voltage suppression (TVS) device having a control input terminal provides a cost-effective and reliable means for improving circuit protection using TVS devices. More specifically, the methods and systems described herein facilitate activating a transient voltage protection system at selectable operating points rather than where the electrical characteristics of a TVS dictate. In addition, the above-described methods and systems facilitate forming a TVS device assembly having various control configurations. As a result, the methods and systems described herein facilitate improving the circuit protection capability of TVS devices in a cost-effective and reliable manner.

Exemplary embodiments of transient voltage suppression (TVS) devices having active control, and methods of forming such devices are not limited to the specific embodiments described herein, but rather, components of devices and/or steps of the methods may be utilized independently and separately from other components and/or steps described herein. For example, the methods may also be used in combination with other devices, and are not limited to practice with only the TVS devices and methods as described herein. Rather, the exemplary embodiment can be implemented and utilized in connection with many other TVS devices without limitation.

Although specific features of various embodiments of the invention may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A transient voltage suppression (TVS) device comprising:
   a first layer of wide band gap semiconductor material formed of a first conductivity type material;
   a second layer of wide band gap semiconductor material formed of a second conductivity type material over at least a portion of the first layer;
   a third layer of wide band gap semiconductor material formed of the first conductivity type material over at least a portion of the second layer; and
   a conductive path electrically coupled between said second layer and an electrical connection to a circuit external to the TVS device, said conductive path configured to permit controlling a turning on of the TVS device at less than a breakdown voltage of the TVS device.

2. The device of claim 1, further comprising a first electrical contact surface on a side of said first layer opposite said second layer.

3. The device of claim 2, further comprising a second electrical contact surface on a side of said third layer opposite said second layer.

4. The device of claim 1, wherein said conductive path comprises a conductive pillar extending through at least one of said third layer and a passivated layer adjacent said third layer and at least partially covering said second layer.

5. The device of claim 1, wherein said conductive path comprises a conductive pillar surrounded by an insulative sheath.

6. The device of claim 1, wherein said TVS device operates using punch-through physics.

7. The device of claim 6, wherein said TVS device is configured to exhibit punch-through characteristics between approximately 5.0 volts and approximately 75.0 volts.

8. The device of claim 6, wherein said TVS device is configured to exhibit punch-through characteristics between approximately 75.0 volts and approximately 200.0 volts.

9. The device of claim 6, wherein said TVS device is configured to exhibit punch-through characteristics at voltages greater than approximately 200 volts.

10. The device of claim 6, wherein said control terminal is positioned to be at least one depletion width away from said third layer at the breakdown voltage, wherein the at least one depletion width is with respect to a junction formed by said second layer and said third layer.

11. The device of claim 6, wherein said control terminal is positioned to be at least one depletion width away from said first layer at zero voltage between said control terminal and a cathode of said device, wherein the at least one depletion width is with respect to a junction formed by said first layer and said second layer.

12. The device of claim 1, wherein said TVS device is configured to conduct a current of greater than 10 kA/cm² during a transient surge event.

13. The device of claim 1, wherein said TVS device is configured to conduct a current of between 5 kA/cm2 and 10 kA/cm2 during a transient surge event.

14. The device of claim 1, wherein said TVS device is configured to conduct a current of between 1 kA/cm² and 5 kA/cm² during a transient surge event.

15. A method of forming a transient voltage suppression (TVS) assembly, said method comprising:
   providing a silicon carbide substrate having a first surface and an opposite second surface;
   forming a first silicon carbide semiconductor layer having a conductivity of a first polarity over at least a portion of the first surface;
   forming a second silicon carbide semiconductor layer having a conductivity of a second polarity over at least a portion of the first surface;
   forming a third silicon carbide semiconductor layer having a conductivity of the first polarity over at least a portion of the first surface; and
   forming a conductive path from the second silicon carbide semiconductor layer to a connection point to a circuit external to the TVS device,
   wherein the TVS device is configured to receive a control signal applied to the conductive path and to turn on at a voltage lower than a breakdown voltage of the TVS device.

16. The method of claim 15, wherein forming a conductive path comprises:
   forming a via through the third layer to access the second layer;
   depositing a dielectric material on an inside surface of the via;
   filling the via with a conductor material.

17. The method of claim 15, further comprises electrically coupling a voltage sensing device to at least one of the first layer and the third layer.

18. The method of claim 15, further comprising electrically coupling a current sensing device to at least one of the first layer and the third layer and configured to detect an inrush current to at least one of the plurality of TVS devices.

19. The method of claim 15, further comprises electrically coupling a plurality of the TVS devices together such that when a first of the plurality of TVS devices turns on the remaining of the plurality of TVS devices turn on using the conductive path.

20. The method of claim 15, further comprising:
   forming the plurality of TVS devices on a first die;
   forming the control circuit on a second die; and
   combining the first and second die into a single integrated circuit package.

21. The method of claim 15, wherein the plurality of TVS devices and the control circuit is formed monolithically on a single die.

22. A transient voltage suppression (TVS) assembly for protecting electrical equipment from transient electrical energy configured to divert electrical energy from the electrical equipment, said TVS assembly comprising:
   a plurality of TVS devices coupled together in at least electrical parallel, said plurality of TVS devices each comprising a first layer formed of a wide band gap semiconductor material of a first conductivity type, a second layer formed of the wide band gap semiconductor material of a second conductivity type, and a third layer formed of the wide band gap semiconductor material of the first conductivity type, each of said plurality of TVS devices comprising an anode, a cathode, and a control lead, the control lead extending through the first layer of each TVS device of said plurality of TVS devices to the second layer of each said TVS device; and
   a control circuit comprising an output terminal communicatively coupled to at least some of the control leads, said control circuit comprising an input configured to sense a turning on of at least some of said plurality of TVS devices, said control circuit configured to generate a control output signal that varies a turning on threshold of the at least some of said plurality of TVS devices or is indicative of the turning on of the at least some of said plurality of TVS devices, said control circuit configured to apply the control output signal to at least some of the control leads, such that the turning on of the plurality of TVS devices are controlled individually or collectively at less than a breakdown voltage of any of the plurality of TVS devices.

23. The assembly of claim 22, wherein said control circuit comprises a voltage sensing device electrically coupled to at least one of said anodes and said cathodes.

24. The assembly of claim 22, wherein said control circuit comprises a current sensing device electrically coupled to at least one of said anodes and said cathodes and configured to detect an inrush current to at least one TVS device of said plurality of TVS devices.

25. The assembly of claim 22, wherein said control circuit is configured to turn on all of a remaining ones of said plurality of TVS devices when a first TVS device of said plurality of TVS devices turns on.

26. The assembly of claim 22, wherein said plurality of TVS devices are formed on a first die, said control circuit is formed on a second die, and the first and second die are combined into a single integrated circuit package.

27. The assembly of claim 22, wherein said plurality of TVS devices and said control circuit are formed monolithically on a single die.

28. The assembly of claim 22, wherein said control circuit is configured to sense a varying input amplitude at at least one of said anode and said cathode and to generate a control output signal relative to the varying input amplitude.

29. The assembly of claim 22, wherein said control circuit is configured to generate a control output signal that varies with a varying input amplitude to the control circuit.

* * * * *